United States Patent
Price et al.

(10) Patent No.: US 6,462,570 B1
(45) Date of Patent: Oct. 8, 2002

(54) BREAKOUT BOARD USING BLIND VIAS TO ELIMINATE STUBS

(75) Inventors: William J. Price, Boulder Creek; Drew G. Doblar, San Jose, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/876,002

(22) Filed: Jun. 6, 2001

(51) Int. Cl.$^7$ ................................................ G01R 31/02
(52) U.S. Cl. ...................... 324/754; 324/765; 324/755
(58) Field of Search ................................ 324/765, 766, 324/761, 763, 757, 755, 754; 361/777, 778, 779–780, 792–793, 795; 174/262–266, 255

(56) References Cited

U.S. PATENT DOCUMENTS 6,372,999 B1 * 4/2002 Bjorndahl et al. .......... 174/262

* cited by examiner

Primary Examiner—Michael Sherry
Assistant Examiner—Tung X. Nguyen

(74) Attorney, Agent, or Firm—Conley, Rose & Tayon, PC; B. Noël Kivlin

(57) ABSTRACT

A test breakout board using blind vias to eliminate stubs. The test breakout board includes a printed circuit board (PCB), having a first set of contact pads on one side and a second set of contact pads which are directly opposite the first set of contact pads on it's other side. Each pad in the first set of contact pads is connected to a corresponding pad in the second set of contact pads through a pair of blind vias, a pair of signal traces and a through-hole via. Each of the through-hole vias is connected to a corresponding contact pin in a test connector. The test connector provides an interface to test equipment such as a logic analyzer or an oscilloscope. The test breakout board may include a test socket for holding a device-under-test (DUT), such as a microprocessor or an application specific integrated circuit (ASIC) chip. Additionally, the breakout board may also include an electrical interface adapter, which mechanically resembles the DUT. The interface adapter provides the interface between the test breakout board and a system motherboard. In a further embodiment, a test breakout board is connected to a system motherboard. The motherboard includes an additional test socket, which can hold a DUT, or in this case, the test breakout board electrical interface adapter. The electrical interface adapter provides a signal path from the system motherboard, through the breakout board, to the DUT.

29 Claims, 4 Drawing Sheets

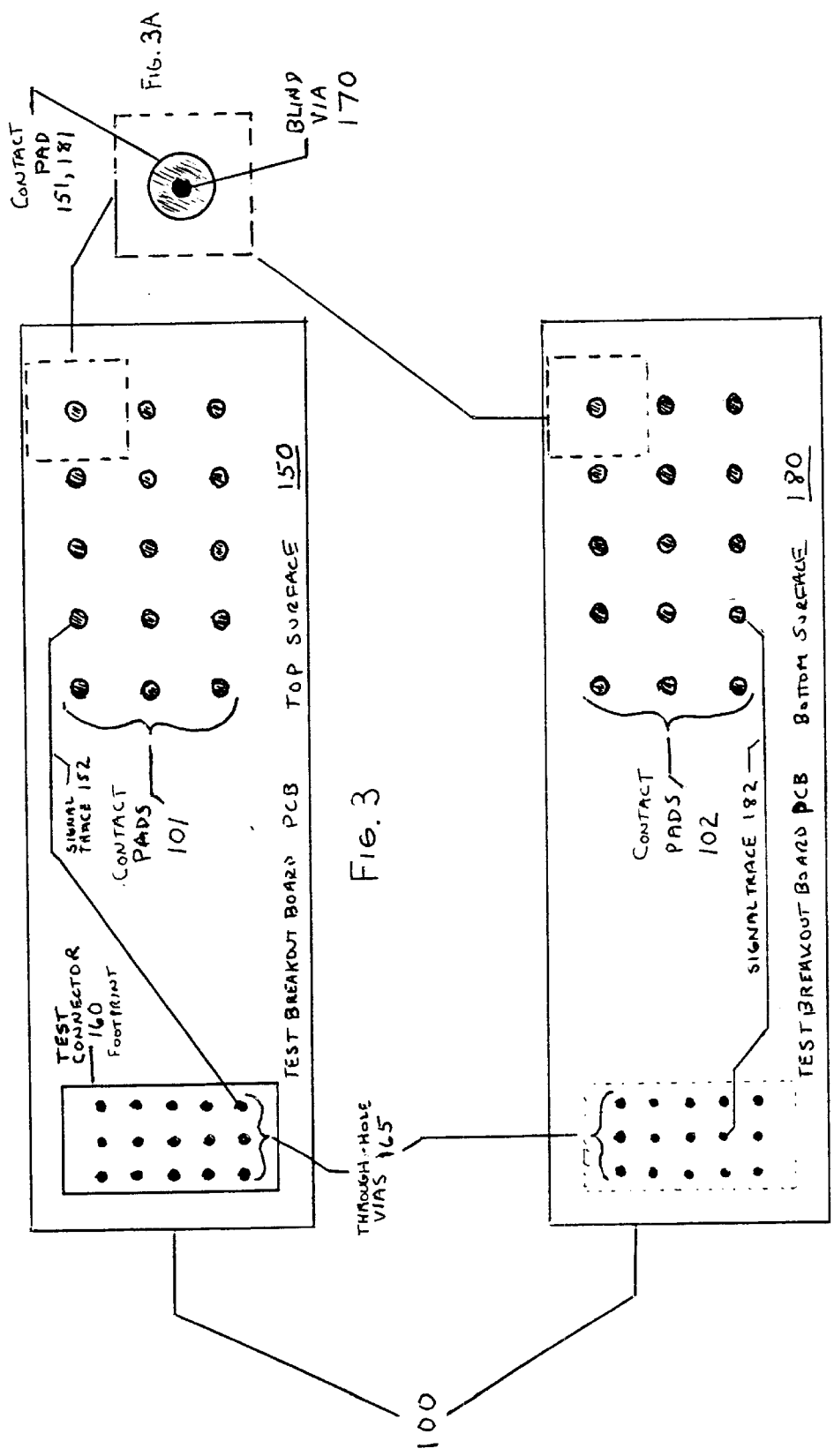

BREAKOUT BOARD USING BLIND VIAS TO ELIMINATE STUBS

BACKGROUND OF THE INVENTION

1. Field of the Invention

This invention relates to testing equipment for integrated circuits, and more particularly, to test breakout boards and their layout.

2. Description of the Related Art

There are many ways to test electronic circuits while the circuit is operating. One method, in particular, is to place the device-under-test (DUT) in a known good operational environment. While in operation, the DUT signals are monitored by test equipment, such as a logic analyzer or oscilloscope.

A common method of monitoring the DUT signals employs a printed circuit board (PCB) known as a breakout board. The breakout board typically includes a device socket, which allows the DUT to be inserted and removed without the need for soldering. The breakout board also provides a means for intercepting the DUT signals and routing them to a test connector. The breakout board is physically located between the DUT and the system board. Therefore, the breakout board also provides a means to connect to the system board in the same way that the DUT would connect to the system board if the breakout board were removed. This is sometimes accomplished by mounting a socket on the system board and a socket adapter on the breakout board.

The breakout board typically has connection areas called pads on the surface of the top layer for soldering a DUT test socket. The pads are typically arranged in a pattern that matches the DUT connection pattern, which is known as a footprint. This footprint is typically duplicated on the bottom PCB layer directly opposite the top layer.

The top layer pads and the bottom layer pads are typically connected together by connections called vias, which are described further below. Small wires called traces connect the pads to power, ground and each other. Since there are often more traces needed than can be manufactured on the surface layers alone, traces are placed on various internal layers. To connect the various internal layer traces to each other and to the surface layers, metal plated connections are used. These connections are called vias. Two types of vias are commonly used: Plated through-hole vias and blind vias.

Plated through-hole vias are holes drilled completely through all layers of the PCB and perpendicular to the surface. The holes are then plated with a conducting metal, such as copper or gold. Through-hole vias can therefore connect signals on any layer to any other layer. Blind vias are holes drilled from the surface through some of the internal layers and then plated with a conducting metal. Therefore, blind vias can connect signals on the surface layer to any internal layers through which it passes.

As shown in FIG. 1, on the breakout board PCB 10, through-hole vias 11 connect the top and bottom contact pads together. The signal traces 16 on various layers connect to the vias at right angles and are routed to the through-hole vias 21 below the test connector 14. The test connector 14 typically includes contact pins 15, which extend down through the through-hole vias 21, where they are soldered to the bottom surface of the PCB. Any test equipment connected to the connector may now receive the DUT signals.

This design works at some frequencies. However, as device clock and signal frequencies increase, circuit board layout becomes a more critical step in producing a fully operational system. Since the PCB traces are transmission lines, their lengths, widths and routing become significant with an increase in frequency in terms of signal quality and strength. In the breakout board design of FIG. 1, the internal layer trace connections to the vias act like transmission line stubs 30. These stubs can create an impedance mismatch at certain frequencies, which can adversely affect the signals. The signal degradation may cause incorrect test readings or complete failure of the DUT in the system during testing. Therefore, it is desirable to provide a better impedance match at the frequencies of interest.

SUMMARY OF THE INVENTION

The problem outlined above may in large part be solved by a breakout board design using blind vias to eliminates stubs on critical timing signal paths.

In one embodiment, a test breakout board comprising a printed circuit board (PCB), which may be implemented in multiple layers, includes a first set of contact pads on one side of the PCB and a second set of contact pads, which are directly opposite the first set of contact pads, on the other side of the PCB. Each pad in the first set of contact pads is connected to a corresponding pad in the second set of contact pads through a pair of blind vias, a pair of signal traces and a throughhole via. Each of the through-hole vias is connected to a corresponding contact pin in a test connector. The test connector is mounted on the top contact of the PCB and provides an interface to test equipment such as a logic analyzer or an oscilloscope. The breakout board may also include a test socket for holding a device-under-test (DUT), such as a microprocessor or an application specific integrated circuit (ASIC) chip. The integrated circuit chip is enclosed in a device package to protect the die. The test socket includes contacts, which are soldered to the first set of contact pads on the top surface of the breakout board. Additionally, the breakout board may also include an electrical interface adapter, which mechanically resembles the DUT. The interface adapter is soldered to the second set of contact pads on the bottom surface of the breakout board and provides the interface between the test breakout board and a system motherboard.

In another embodiment, a test breakout board is connected to a system motherboard. The system motherboard includes an additional test socket, which can hold a DUT, or in this case, a test breakout board electrical interface adapter. The electrical interface adapter mechanically fits into the additional test socket. The contacts on the adapter make contact with a set of metallic contacts in the socket, thereby providing a signal path from the system motherboard, through the breakout board, to the DUT. A test connector on the test breakout board allows test equipment, such as a logic analyzer or an oscilloscope, to be connected to the test breakout board.

The signal path from each of the contact pads through each blind via, through a signal trace, a through-hole via, a second signal trace and a second blind via, to each second contact pad may advantageously provide an impedance matched signal path from a system motherboard to a DUT and a test connector. Thus, the test breakout board may facilitate proper testing at high frequencies.

BRIEF DESCRIPTION OF THE DRAWINGS

Other objects and advantages of the invention will become apparent upon reading the following detailed description and upon reference to the accompanying drawings in which:

FIG. 3 is an illustration of one embodiment of the top surface of a breakout board printed circuit board.

FIG. 3A is a diagram of one embodiment of a contact pad of FIG. 2.

FIG. 4 is an illustration of one embodiment of the bottom surface of a breakout board printed circuit board.

Figure 1:
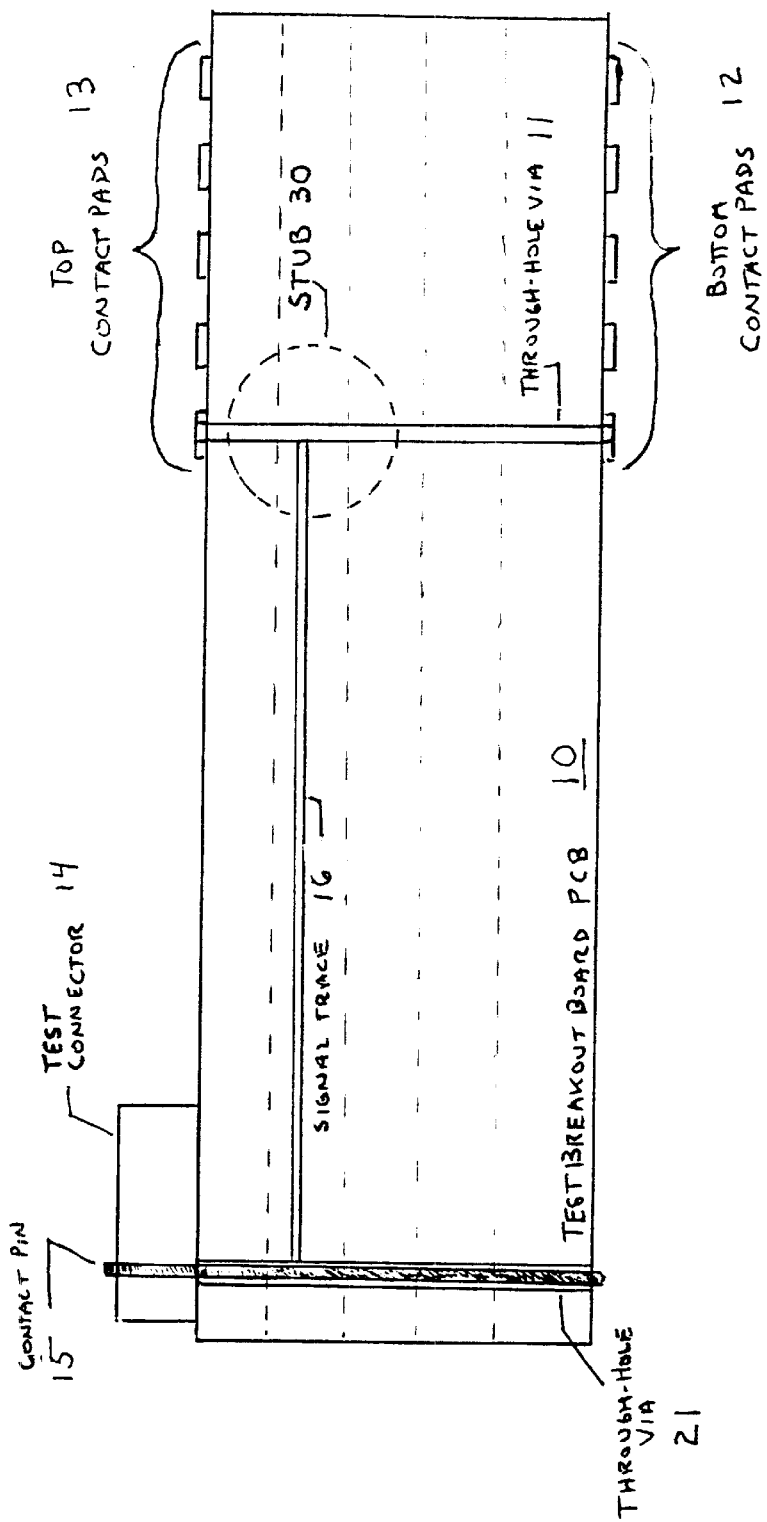
FIG. 1 is a prior art diagram of one embodiment of a test system, including the breakout board PCB.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
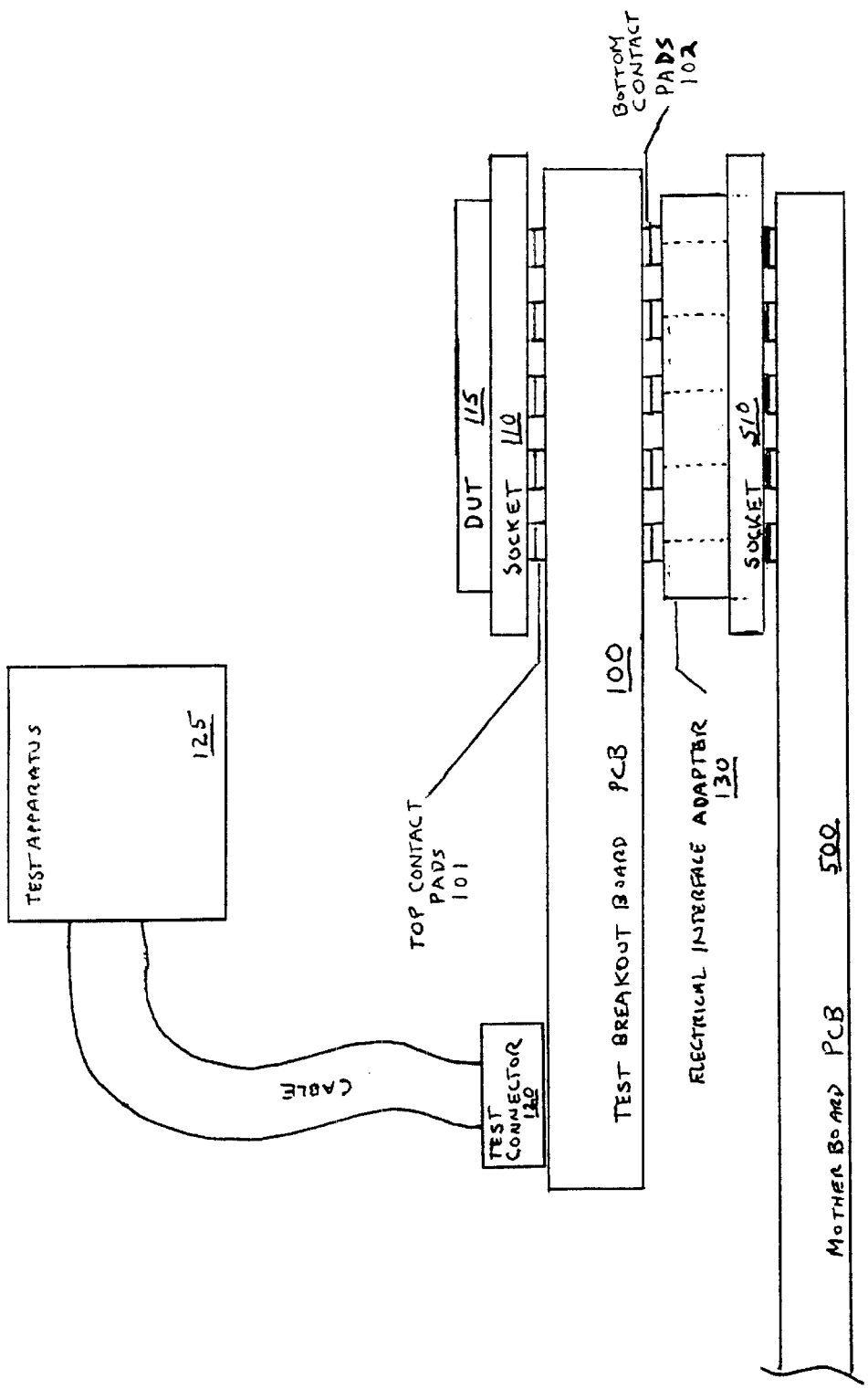
FIG. 2 is a diagram of one embodiment of a test system, including a test breakout board printed circuit board and a system motherboard.

Referring now to FIG. 2, one embodiment of a test system, including a test breakout board printed circuit board (PCB) 100 and a system motherboard PCB 500 is shown. A device socket 510 is mounted to motherboard PCB 500. Test breakout board PCB 100 includes a plurality of top contact pads 101 and a plurality of bottom contact pads 102. An additional device socket 110 is coupled to the plurality of top contact pads 101. Device socket 110 holds a device (DUT) 115 during testing. An electrical interface adapter 130 is mounted to the plurality of bottom contact pads 102. A test connector 120 is mounted to the top surface of the test breakout board PCB 100. A test apparatus, or test equipment 125 is connected to test connector 120 through a test cable 126.

During device testing, a DUT 115 is placed in socket 110. All device power, ground and signals come from motherboard PCB 500. These signals are routed up through the test breakout board PCB 100 to DUT 115. As will be shown in greater detail in FIG. 5, the device signals are routed from the bottom contact pads 102 up through a plurality of blind vias, through-hole vias, and signal traces to the top contact pads 101. The test breakout board 100 also routes DUT 115 signals to test connector 120. The signal traces may be routed on many of the test breakout board PCB 100 layers. Test equipment 125, such as a logic analyzer, is connected to test connector 120 to monitor DUT 115 signals.

Turning to FIG. 3, an illustration of one embodiment of the top surface of the test breakout board printed circuit board (PCB) 100 of FIG. 2 is shown. The top surface 150 includes a set of contact pads 101. The contact pads 101 are arranged in a pattern matching a device or device socket footprint (not shown). The contact pads 101 are typically connected to either a signal trace 152 or a via as shown in more detail in FIG. 3A. Contact pads 101 are typically void of solder mask to allow for soldering. Top surface 150 also includes a test connector footprint 160. The footprint includes a pattern of a plurality of through-hole vias 165.

In FIG. 3A, one embodiment of a contact pad 101 of FIG. 3 and contact pad 102 of FIG. 4 is shown in greater detail. A blind via 170 is electrically connected to contact pad 101, 102 and located near the center of contact pad 101, 102. Although the blind via 170 is shown near the center of contact pad 101, 102, it should be noted, that blind via 170 may be located outside of the actual contact pad area, but connected to contact pad 101,102 by a signal trace on the surface.

Referring now to FIG. 4, one embodiment of the bottom surface of the test breakout board printed circuit board (PCB) 100 of FIG. 2 is shown. The bottom surface 180 includes a set of contact pads 102. The contact pads 102 are arranged in a pattern matching a device or device socket footprint (not shown) and are located directly opposite the contact pads 101 of FIG. 3. The contact pads 102 are typically connected to either a signal trace 182 or a via as shown in more detail in FIG. 3A. Contact pads 102 are typically void of solder mask to allow for soldering. Bottom surface 180 also includes a plurality of through-hole vias 165 in the pattern of test connector footprint 160 of FIG. 3.

Figure 5:
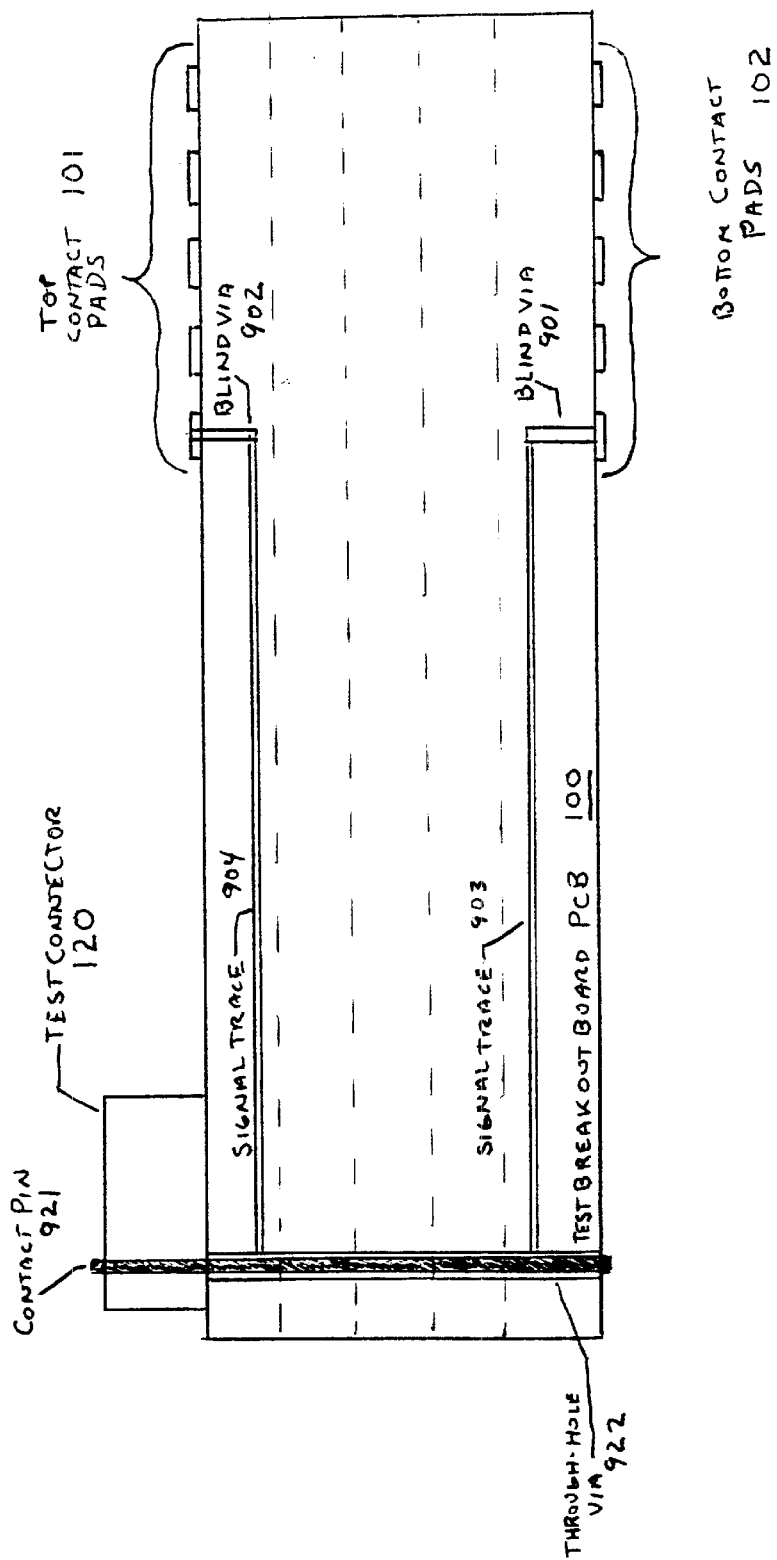
FIG. 5 is an illustration of an embodiment of a breakout board printed circuit board.

Turning now to FIG. 5, an embodiment of test breakout board printed circuit board (PCB) 100 of FIG. 2 is shown. Test breakout board PCB 100 includes a plurality of top contact pads 101 coupled to a plurality of blind vias 901. A plurality of bottom contact pads 102 is coupled to a plurality of blind vias 902. Test breakout board PCB 100 also includes a test connector 120, which is mounted to the top surface of breakout board PCB 100. Test connector 120 includes a plurality of contact pins 921. As an example, contact pin 921 extends down through a through-hole via 922 and may be soldered in place. In this example, a signal comes up from one of the bottom contact pads 930 and is coupled to through-hole via 922 through a blind via 901 and a signal trace 903. The signal is then routed through a signal trace 904 to a blind via 902 and up through one of the top contact pads 925.

During the device operation described in FIG. 1, the signal trace routing and use of the blind vias of FIG. 5 may advantageously improve the signal integrity of some critical timing path signals by eliminating the presence of transmission line stubs and therefore, the impedance mismatches caused by those stubs.

Numerous variations and modifications will become apparent to those skilled in the art once the above disclosure is fully appreciated. It is intended that the following claims be interpreted to embrace all such variations and modifications.

What is claimed is:

1. A test breakout board comprising:
   a printed circuit board;
   a first plurality of contact pads arranged on a first side of said printed circuit board;
   a second plurality of contact pads arranged directly opposite said first plurality of contact pads on an opposite side of said printed circuit board;
   a first plurality of blind vias, which electrically connect to said first plurality of contact pads;
   a second plurality of blind vias, which electrically connect to said second plurality of contact pads;
   a first plurality of signal traces internal to said printed circuit board which electrically connects to said first plurality of blind vias;
   a second plurality of signal traces internal to said printed circuit board which electrically connects to said second plurality of blind vias;
   a plurality of through-hole vias offset from said first plurality of contact pads and said second plurality of contact pads and electrically connected to said first and second plurality of signal traces; and a test connector, including a plurality of contacts pins, mounted on said printed circuit board, wherein said plurality of contacts pins are electrically connected to said plurality of through-hole vias.

2. The test breakout board as recited in claim 1, wherein said test connector is positioned on said first side of said printed circuit board.

3. The test breakout board as recited in claim 1, wherein said test connector is positioned above said plurality of through-hole vias.

4. The test breakout board as recited in claim 1, wherein each of said first plurality of contact pads is positioned directly opposite to a corresponding one of said second plurality of contact pads.

5. The test breakout board as recited in claim 1, wherein each of said first plurality of contact pads is electrically connected to a corresponding one of said second plurality of contact pads through a pair of corresponding ones of said blind vias.

6. The test breakout board as recited in claim 5, wherein a first one of said plurality of through-hole vias is electrically connected to a first one of said first plurality of blind vias by a first one of said first plurality of signal traces and is electrically connected to a corresponding first one of said second plurality of blind vias by a first one of said second plurality of signal traces.

7. The test breakout board as recited in claim 6 further comprises a test socket for holding a device-under-test, wherein said test socket is mounted on said first side of said printed circuit board.

8. The test breakout board as recited in claim 7, wherein said test socket includes a first plurality of contacts which are electrically connected to said first plurality of contact pads.

9. The test breakout board as recited in claim 8 further comprises an electrical interface adapter, which mechanically resembles said device-under-test, wherein said electrical interface adapter is mounted on said second side of said printed circuit board.

10. The test breakout board as recited in claim 9, wherein said electrical interface adapter includes a plurality of contacts, which are electrically connected to said second plurality of contact pads.

11. The test breakout board as recited in claim 7, wherein said device-under-test is an integrated circuit chip enclosed in a device package.

12. A testing system comprising:
a motherboard;
a first test socket coupled to said motherboard;
a test breakout board coupled to said motherboard including:
a printed circuit board;
a first plurality of contact pads arranged on a first side of said printed circuit board;
a second plurality of contact pads arranged directly opposite said first plurality of contact pads on an opposite side of said printed circuit board;
a first plurality of blind vias, which electrically connect to said first plurality of contact pads;
a second plurality of blind vias, which electrically connect to said second plurality of contact pads;
a plurality of through-hole vias offset from said first plurality of contact pads and said second plurality of contact pads;

a first plurality of signal traces internal to said printed circuit board, which electrically connect to said first plurality of blind vias;

a second plurality of signal traces internal to said printed circuit board, which electrically connect to said second plurality of blind vias;

a plurality of through-hole vias offset from said first plurality of contact pads and said second plurality of contact pads and electrically connected to said first and second plurality of signal traces;

a test connector, including a plurality of contacts pins, mounted on said printed circuit board, wherein said contacts pins are electrically connected to said plurality of through-hole vias; and a test apparatus coupled to said test breakout board.

13. The testing system as recited in claim 12, wherein said test connector is positioned on said first side of said printed circuit board.

14. The testing system as recited in claim 12, wherein said test connector is positioned above said plurality of through-hole vias.

15. The testing system as recited in claim 12, wherein each of said first plurality of contact pads is positioned directly opposite to a corresponding one of said second plurality of contact pads.

16. The testing system as recited in claim 12, wherein each of said first plurality of contact pads is electrically connected to a corresponding one of said second plurality of contact pads through a pair of corresponding ones of said blind vias.

17. The testing system as recited in claim 12, wherein a first one of said plurality of through-hole vias is electrically connected to a first one of said first plurality of blind vias by a first one of said first plurality of signal traces and is electrically connected to a corresponding first one of said second plurality of blind vias by a first one of said second plurality of signal traces.

18. The testing system as recited in claim 12, wherein said motherboard includes a third plurality of contact pads corresponding to said second plurality of contact pads.

19. The testing system as recited in claim 12, wherein said first test socket includes a first plurality of contacts, which are electrically connected to said third plurality of contact pads.

20. The testing system as recited in claim 17, wherein said test breakout board further comprises a second test socket, for holding a device-under-test, wherein said second test socket is mounted on said first side of said printed circuit board.

21. The testing system as recited in claim 20, wherein said second test socket includes a second plurality of contacts which are electrically connected to said first plurality of contact pads.

22. The testing system as recited in claim 21, wherein said test breakout board further comprises an electrical interface adapter, which mechanically resembles said device under-test, wherein said electrical interface adapter is mounted on said second side of said printed circuit board.

23. The testing system as recited in claim 22, wherein said electrical interface adapter includes a third plurality of contacts, which are electrically connected to said second plurality of contact pads.

24. The testing system as recited in claim 20, wherein said device-under-test is an integrated circuit chip enclosed in a device package.

25. The testing system as recited in claim 12, wherein said piece of test equipment is connected to said test breakout board though said test connector.

26. The testing system as recited in claim 12, wherein said test apparatus is a logic analyzer.

27. The testing system as recited in claim 12, wherein said test apparatus is an oscilloscope.

28. The testing system as recited in claim 20, wherein said device-under-test is a microprocessor.

29. The testing system as recited in claim 20, wherein said device-under-test is an application specific integrated circuit (ASIC) chip.

* * * * *